United States Patent
Nakashima (10) Patent No.: US 12,160,645 B2
(45) Date of Patent: Dec. 3, 2024

(54) ELECTRONIC DEVICE

(71) Applicant: CANON KABUSHIKI KAISHA, Tokyo (JP)

(72) Inventor: Shinga Nakashima, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 65 days.

(21) Appl. No.: 17/880,084

(22) Filed: Aug. 3, 2022

(65) Prior Publication Data
US 2023/0059185 A1   Feb. 23, 2023

(30) Foreign Application Priority Data
Aug. 18, 2021   (JP) .................. 2021-133406

(51) Int. Cl.
*H04N 23/50*   (2023.01)
*H03K 17/965*   (2006.01)

(52) U.S. Cl.
CPC ........... *H04N 23/50* (2023.01); *H03K 17/965* (2013.01); *H03K 2217/9651* (2013.01)

(58) Field of Classification Search
CPC ............ H04N 23/50; H04N 23/51; H04N 1/00384–004; H03K 17/965; H03K 2217/9651; H03K 2217/94106

USPC ........................................................ 348/376
See application file for complete search history.

(56) References Cited

U.S. PATENT DOCUMENTS

| | | | |
|---|---|---|---|
| 2005/0094014 A1* | 5/2005 | Haas .................. | H04N 1/00458 348/333.01 |
| 2019/0060746 A1* | 2/2019 | Ironmonger ............ | A63F 13/24 |
| 2020/0007747 A1* | 1/2020 | Ueda ...................... | H04N 23/63 |
| 2020/0353349 A1* | 11/2020 | Palmer .................... | A63F 13/24 |
| 2021/0325866 A1* | 10/2021 | Chan ....................... | G05G 13/00 |

FOREIGN PATENT DOCUMENTS

| | | |
|---|---|---|
| JP | 5365910 B2 | 12/2013 |
| JP | 6344141 B2 | 6/2018 |

* cited by examiner

*Primary Examiner* — Lin Ye
*Assistant Examiner* — Chan T Nguyen
(74) *Attorney, Agent, or Firm* — Cowan, Liebowitz & Latman, P.C.

(57) ABSTRACT

An electronic device includes a rotation operation unit including a rotation operation member, and a finger placing portion configured so that a finger is placed on it when the electronic device is gripped. The rotation operation unit and the finger placing portion are located in close proximity to each other on a surface on a user side of the electronic device. The rotation operation unit is tilted with respect to the electronic device toward the finger placing portion.

12 Claims, 8 Drawing Sheets

ELECTRONIC DEVICE

BACKGROUND OF THE INVENTION

Field of the Invention

The present disclosure relates to an electronic device.

Description of the Related Art

In recent years, as small-sized electronic devices have been in demand, operation members have been disposed at positions noticeably closer to each other and have become noticeably smaller. On the other hand, there is a need for a multifunction device including more operation members for easy operation. If a size of a multifunction device is reduced, it may be difficult for a user to use the multifunction device because, on the multifunction device, the operation members are disposed in close proximity to each other and/or many members are arranged. As a result, operability of the multifunction device for the user is likely to deteriorate.

If an electronic device has a small size and includes a plurality of operation members, there is a small space for a user to grip the electronic device when the user holds the electronic device. As a result, it becomes difficult for the user to stably hold the electronic device. Hence, it is difficult to realize both high operability and stable holding of a multifunctional electronic device.

There is an operation device including, on a same axis, as operation members for enabling many operations in a small space, a dial operation member that can be rotationally operated and enables quick selection for many selection items, and a tilt switch operation member that can be tilted in multiple directions including, for example, up, down, left, right, and a direction of decision operation. In a case where such an operation device is provided on an electronic device, it is possible to minimize a movement of a finger when various operations are performed on the electronic device. However, since such an operation device includes many components, the size of the operation device becomes large.

In a case where a user uses an electronic device including such an operation device, when holding the electronic device, the user places a finger on a finger placing portion (a space gripped by the finger) so as to stably hold the electronic device. When operating the electronic device, the user moves the finger to the operation device and operates it. However, if a position of the finger placing portion that improves stable holding of the electronic device and a position of the operation device that improves operability are taken into account, the finger placing portion and the operation device are located far from each other, and the user cannot smoothly transition between the holding and the operation.

In order that such a problem is solved, in Japanese Patent No. ("JP") 5365910, a finger placing portion and an operation device including a rotation operation member are arranged next to each other, and heights are made to be different between the finger placing portion and the operation device. This improves operability while minimizing a moving amount of a finger in a transition between holding and operating the electronic device. In JP 6344141, a rotation operation member is disposed at a position on an extension of a finger placing portion. This allows a user to operate the rotation operation member with a part of a finger while the user grips an electronic device, realizing holding and operating at the same time.

However, with a configuration as in JP 5365910 in which the operation device is disposed at a position in close proximity to the finger placing portion and their heights are made different, if the user operates the rotation operation member while placing the finger on the finger placing portion and holding the electronic device, the operability of the rotation operation member deteriorates. When the user operates a part of the rotation operation member close to the finger placing portion, the moving amount of the finger is small, and therefore an effect on operability is small. On the other hand, when the user operates a part of the rotation operation member far from the finger placing portion, the user needs to greatly bend the finger or change the holding position of the hand in order to perform a rotational operation.

With a configuration as in JP 6344141 in which the rotation operation member is disposed on the extension of the finger placing portion, the user can operate the rotation operation member even while holding the electronic device, but cannot continuously perform a rotational operation. Further, since only the rotation operation member is included, the user cannot perform operations in directions of up, down, left, right, and a direction of decision operation.

SUMMARY OF THE INVENTION

The present disclosure provides an electronic device that has a configuration including a finger placing portion and a rotation operation member that can be rotationally operated and can allow a user to stably perform a rotational operation on the rotation operation member while stably holding the electronic device.

An electronic device according to one aspect of the present disclosure includes a rotation operation unit including a rotation operation member, and a finger placing portion configured so that a finger is placed on it when the electronic device is gripped. The rotation operation unit and the finger placing portion are located in close proximity to each other on a surface on a user side of the electronic device. The rotation operation unit is tilted with respect to the electronic device toward the finger placing portion.

Further features of the present disclosure will become apparent from the following description of exemplary embodiments with reference to the attached drawings.

DESCRIPTION OF THE EMBODIMENTS

Referring now to the accompanying drawings, a description is given of an electronic device according to each embodiment. Dimensions, materials, and shapes of components, relative arrangements thereof, etc. described below may be properly modified depending on a configuration of a device to which the present disclosure is to be applied and depending on various conditions. Therefore, the following description is not intended to limit the scope of the present invention. In particular, a well-known technique or a publicly available technique in the relevant technical field may be applied as a configuration or a process not specifically illustrated or described. Further, a duplicate description may be omitted. In the drawings, the same reference numerals are used in different drawings to indicate elements that are the same or functionally similar.

First Embodiment

Regarding an electronic device according to the first embodiment, a description is given of an image pickup apparatus such as a mirrorless digital camera 100 as an example, but the present disclosure is not limited to this.

Figure 1:
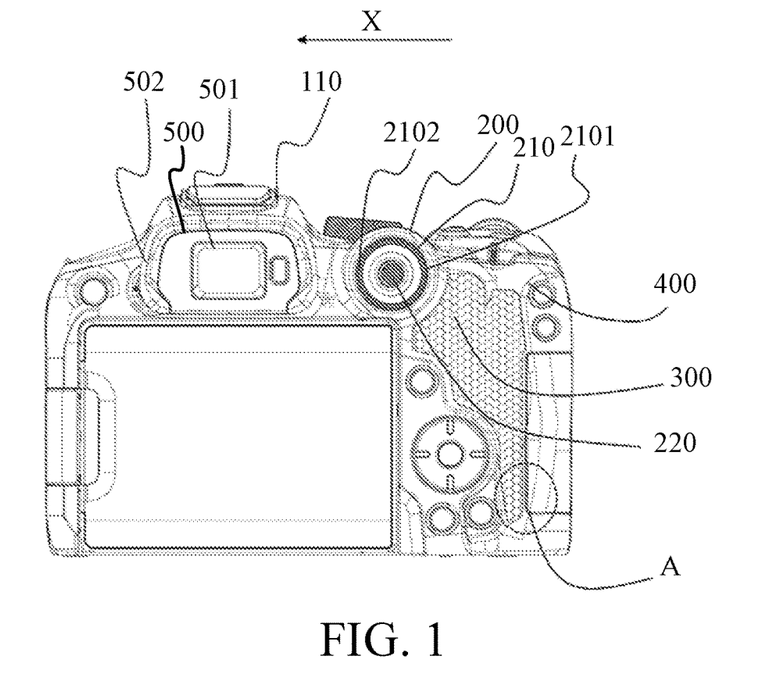
FIG. 1 is a rear view of a digital camera according to a first embodiment.

FIG. 1 is a rear view of the digital camera (image pickup apparatus) 100. A rear surface unit, which is a photographer side (user side) surface of the digital camera 100, includes a rotation operation unit 200 used for operating the digital camera 100. The rotation operation unit 200 includes a rotation operation member 210 and a tilt operation member (pusher member) 220.

In the vicinity of the rotation operation unit 200, a finger placing portion 300 on which a user (photographer) places a finger when gripping the digital camera 100 is disposed. The digital camera 100 according to this embodiment is configured to be gripped by a right hand. Therefore, the finger placing portion 300 is disposed at a position such that the digital camera 100 can be gripped by a thumb of the right hand. The finger placing portion 300 may include an elastic material (for example, rubber or silicon) so that the finger hardly slips on the digital camera 100 when the user holds the digital camera 100. The rotation operation unit 200 is disposed at a position in a direction away from the finger placing portion 300 (X direction in FIG. 1). The finger placing portion 300 and the rotation operation unit 200 are arranged in close proximity to each other on the rear surface unit of the digital camera 100. A finger holding convex portion 400 is provided at a position on an opposite side of the rotation operation unit 200 across the finger placing portion 300 (so that the finger placing portion 300 is located between the finger holding convex portion 400 and the rotation operation unit 200). The finger holding convex portion 400 projects from the digital camera 100 by a larger amount than the finger placing portion 300 in as described below. Thereby, when the user grips the digital camera 100, the user holds the finger holding convex portion 400 with the finger, and the user can stably hold the digital camera 100.

On the rear surface unit of the digital camera 100, a finder unit 500 is provided at a position adjacent to the rotation operation unit 200 in the X direction. The finder unit 500 includes inside an unillustrated electronic viewfinder (hereinafter referred to as EVF) that displays an image by a display element such as an unillustrated organic EL panel. The user can view the image displayed on the EVF through the finder part 501. An eyecup 502 is provided on an outer peripheral portion of the finder unit 500. When the user looks into the finder part 501, a user's face comes into contact with the eyecup 502. Therefore, the eyecup 502 is made of an elastic member such as silicon and has a cushioning property. An exterior portion of the digital camera 100 includes a convex portion 110 to which the finder unit 500 is attached. The above-described EVF is disposed inside the convex portion 110.

This embodiment uses a mirrorless configuration that displays an image input to an image sensor through an optical lens on the electronic viewfinder. Therefore, the electronic viewfinder is located inside the finder part 501. However, this embodiment is not limited to this, and may use a single-lens reflex configuration in which an optical finder allows the user to view, through the finder part 501, light passing through the lens.

Figure 2:
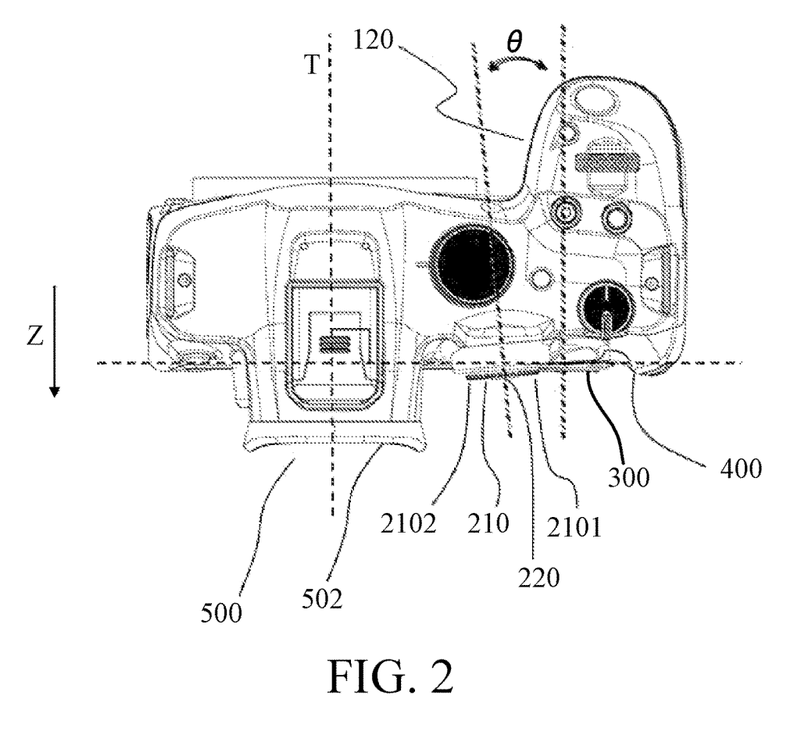
FIG. 2 is an upper view of the digital camera according to the first embodiment.

FIG. 2 is a top view of the digital camera 100. On the front side of the digital camera 100, a front grip portion 120 for the user to grip the front side is provided. By gripping, with the right hand, the front grip portion 120 on the front side of the digital camera 100 and the finger placing portion 300 on the rear side, the user holds the digital camera 100.

The finger holding convex portion 400, which is included as a part of the exterior unit of the digital camera 100, is disposed on the side surface side of the finger placing portion 300, and projects from the digital camera 100 in the Z direction in the drawing by a larger amount than the finger placing portion 300. The eyecup 502 included in the finder unit 500 projects from the digital camera 100 by a larger amount than the finger placing portion 300 and the rotation operation unit 200.

In this embodiment, the finger placing portion 300 is arranged substantially orthogonally to the digital camera 100 and faces substantially the same direction as an optical axis direction (T direction in the drawing) of the digital camera 100. Thus, the user can stably grip the digital camera 100 at the front grip portion 120 and the finger placing portion 300.

Figure 3:
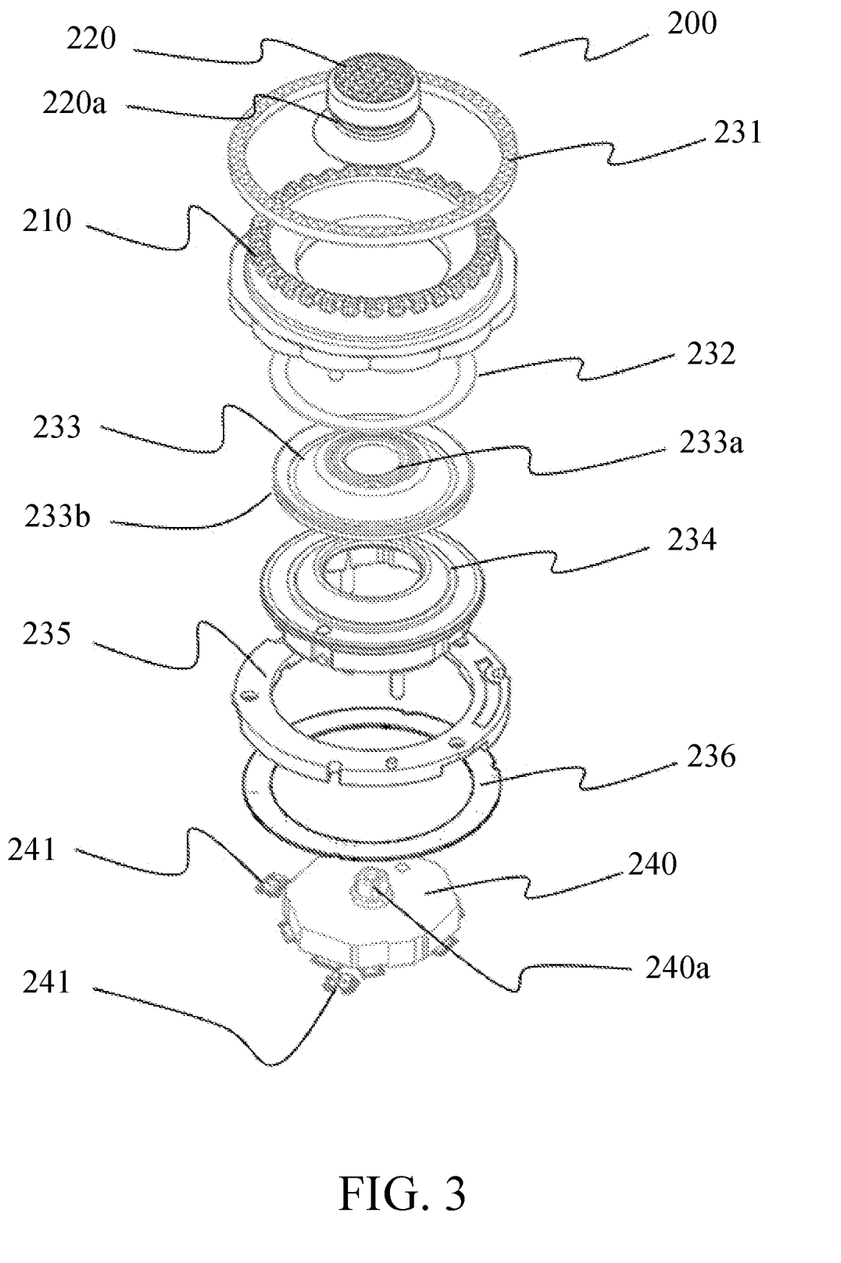
FIG. 3 is an exploded view of a rotation operation unit according to the first embodiment.

Next, a description is given of a configuration of the rotation operation unit 200 with reference to FIG. 3. FIG. 3 is an exploded view of the rotation operation unit 200. The rotation operation unit 200 according to this embodiment includes a rotation operation system that performs a rotational operation, a tilt operation system that performs a tilt operation, and other members that holds units.

The rotation operation system includes the rotation operation member 210, a unit elastic member 231, a sliding sheet 232, a holding member 235, a detection sheet 236, and a photo-reflector 241 that is mounted on an unillustrated print circuit board. The rotation operation member 210 has an annular shape. By rotating the rotation operation member 210, the user changes settings of the digital camera 100, selects an image, and the like. The rotation operation member 210 is rotatably supported by a base member 234. The base member 234 is sandwiched between and held by the rotation operation member 210 and the holding member 235. The unit elastic member 231 that comes into contact with an exterior member of the digital camera 100 is attached to an outer circumferential portion of the rotation operation member 210. On the unit elastic member 231, an unillustrated adhesive is provided at a position where the unit elastic member 231 comes into contact with the rotation operation member 210, and the rotation operation member 210 and the unit elastic member 231 are fixed (or adhered). When the rotation operation unit 200 is attached to the digital camera 100, the exterior unit of the digital camera 100 and the unit elastic member 231 come into contact with each other. Then, when the rotation operation member 210 is rotationally operated, the unit elastic member 231 rotates integrally with the rotation operation member 210 as a whole. The sliding sheet 232 is fixed to the back side of the rotation operation member 210 with an unillustrated adhesive, and when the rotation operation member 210 is rotationally operated, the sliding sheet 232 rotates integrally with the rotation operation member 210 as a whole. On the lower side of the base member 234, the holding member 235 fixed to the rotation operation member 210 is placed. The detection sheet 236 is fixed to the back side of the holding member 235 by an unillustrated adhesive. When the rotation operation member 210 is rotationally operated, the holding member 235 and the detection sheet 236 rotate integrally as a whole. The photo-reflector 241 is disposed at a position facing the detection sheet 236. In this embodiment, black and white marks are printed on the detection sheet 236, and the photo-reflector 241 detects the printed portion of the detection sheet 236 that rotates integrally with the rotation operation member 210 when the rotation operation member 210 is operated, and thereby detects the rotation.

The tilt operation system of the rotation operation unit 200 includes a tilt operation member 220, a sealing member 233, and a movable switch (switch) 240. The tilt operation member 220 is formed on a same axis as the rotation axis of the rotation operation member 210, and is included in the rotation operation unit 200 as an operation member configured to tilt. In this embodiment, the tilt operation member 220 is formed on the same axis as the rotation axis of the rotation operation member 210, but may not be formed on strictly the same axis as the rotation axis of the rotation operation member 210. The tilt operation member 220 may be formed on an axis substantially same as the rotation axis of the rotation operation member 210 as long as the tilt operation member 220 functions properly. A switch shaft portion 240*a* of the movable switch 240 mounted on the unillustrated print circuit board is fitted into the tilt operation member 220. The movable switch 240 detects that the switch shaft portion 240*a* is tilted in any of eight directions including up, down, left, right, and diagonal directions, and that the switch shaft portion 240*a* is pushed into the shaft direction. In this embodiment, the movable switch 240 is a switch on which eight-direction inputting operation and push-in inputting operation can be performed, but the present disclosure is not limited to this, and the movable switch 240 may be a switch that detects a tilting operation. When the tilt operation member 220 is operated during input operation on the digital camera 100, the movable switch 240 detects tilting via the switch shaft portion 240*a* fitted into the tilt operation member 220. A sealing member inner circumferential portion 233*a*, which is an inner circumferential portion of the sealing member 233, is fitted into a concave portion 220*a* of the tilt operation member 220. The sealing member 233 is made of an elastic member. When the tilt operation member 220 is tilted, the sealing member 233 also moves together and maintains the fitting state. A sealing member outer circumferential portion 233*b*, which is an outer circumferential portion of the sealing member 233, is in contact with an inner circumferential portion of the rotation operation member 210, and seals a gap between the rotation operation member 210 and the tilt operation member 220.

Figure 4:
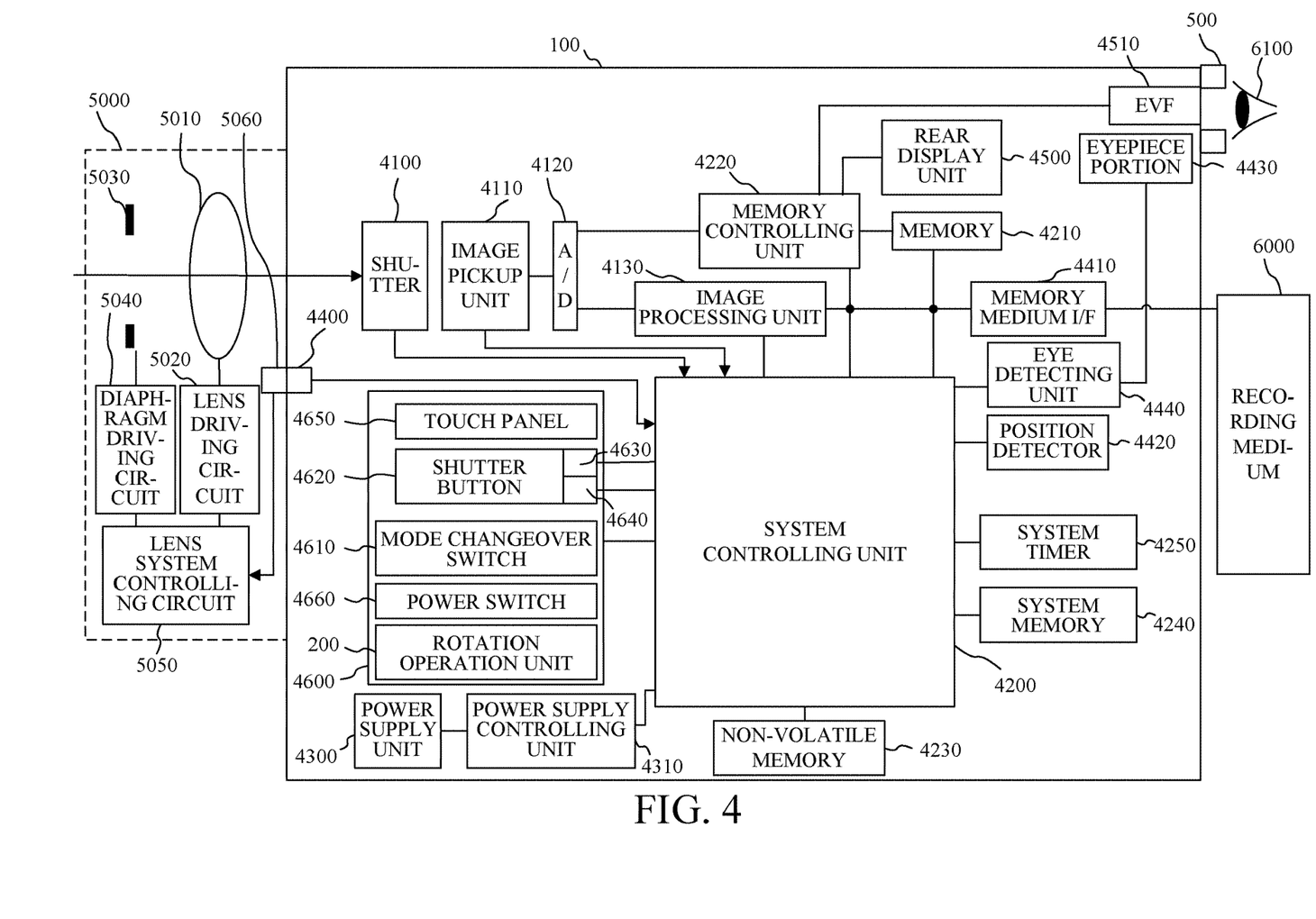
FIG. 4 is a block diagram illustrating a system configuration of the digital camera according to the first embodiment.

Next, a description is given of a system configuration of the digital camera 100 according to this embodiment with reference to FIG. 4. FIG. 4 is a block diagram illustrating the system configuration of the digital camera 100 according to this embodiment.

A shutter 4100 is a focal plane shutter with which an exposure time of an image pickup unit 4110, which is described below, can be freely controlled. The control thereof is performed by a system controlling unit 4200 described below.

The image pickup unit 4110 is an image pickup device including an image pickup plane on which an object image (optical image) that has passed through a lens 5010 is formed, and outputs an electric signal (analog signal) corresponding to the optical image on the image pickup plane by performing photoelectric conversion. As the image pickup unit 4110, a charge-coupled device (CCD) sensor or a complementary MOS (CMOS) sensor is used. An A/D converter 4120 is a signal converting unit used for converting the analog signal output from the image pickup unit 4110 into a digital signal.

An image processing unit 4130 is an image calculating unit that generates image data by performing predetermined pixel interpolation processing, resizing processing such as reduction, and color conversion processing on the digital signal from the A/D converter 4120 or a digital signal from a memory controlling unit 4220, which is described below. Based on a calculation result obtained by the image processing unit 4130, the system controlling unit 4200 provides control on a diaphragm position and a lens position. The image processing unit 4130 further performs calculation processing using image data, and performs TTL-type auto white balance (AWB) processing based on the obtained calculation result.

The system controlling unit 4200 is a controlling unit including at least one processor or circuit, and controls the entire digital camera 100. The system controlling unit 4200 realizes each process by executing a program recorded in a non-volatile memory 4230 described later. A memory 4210 temporarily records the digital signal obtained by the image pickup unit 4110 and converted by the A/D converter 4120 and the image data generated by the image processing unit 4130. The memory 4210 has a storage capacity sufficient to store a predetermined number of still images and a predetermined length of motion images and audio data.

The memory controlling unit 4220 is a memory controller that controls transmission/reception of data to/from the A/D converter 4120, the image processing unit 4130, and the memory 4210, and the transmission/reception of the data is controlled by the system controlling unit 4200. The digital signal output from the A/D converter 4120 is written directly to the memory 4210 via the image processing unit 4130 and the memory controlling unit 4220, or only via the memory controlling unit 4220. The non-volatile memory 4230 is a read-only memory from/in which data can be electrically deleted/recorded, and stores a constant, a program, and the like for operation of the system controlling unit 4200.

A system memory 4240 is a readable and writable memory that stores a constant, a variable, a program that has been read from the non-volatile memory 4230, and the like for operation of the system controlling unit 4200. A system timer 4250 is a timing unit that measures a time until an execution of auto power off for turning off various display members described below in order to prevent battery consumption in a case where it is determined that the user is not operating the digital camera 100, and measures the exposure time.

A power supply unit 4300 includes a primary battery, such as an alkaline battery and a lithium battery, a secondary battery, such as a NiCd battery, a NiMH battery, and a Li battery, an AC adapter, and the like. A power supply controlling unit 4310 includes a circuit for detecting the power supply unit 4300 that supplies power for driving the digital camera 100, a DC-DC converter, a switch circuit for switching a power supply destination, and the like, and detects whether or not a battery is attached, a type of the battery, and a remaining battery level. The power supply controlling unit 4310 controls the DC-DC converter based on the above-described detection result and an instruction from the system controlling unit 4200, and supplies a necessary voltage to the supply destination at a necessary timing.

A communication terminal 4400 is provided on the digital camera 100 and is electrically connected to a lens communication terminal 5060 described below. In a state where the communication terminal 4400 is electrically connected to the lens communication terminal 5060, the system controlling unit 4200 that controls the entire digital camera 100 can communicate with a lens unit 5000 described below. A memory medium I/F 4410 is an interface with a recording medium 6000 described below.

A position detector 4420 detects an orientation or a position of the digital camera 100 with respect to a gravity direction. Based on the detected orientation, the position detector 4420 can output orientation information on whether an image captured by the image pickup unit 4110 is captured in a state where the digital camera 100 is horizontally held or in a state where the digital camera 100 is vertically held. The system controlling unit 4200 can add the orientation information output by the position detector 4420 to the image data. As the position detector 4420, an acceleration sensor, a gyro sensor, or the like can be used. In a case where an acceleration sensor or a gyro sensor is used as the position detector 4420, it is possible to further detect a motion (panning, tilting, lifting, whether or not the digital camera 100 is stationary, etc.) of the digital camera 100.

The finder unit 500 is a position where a user's eye (object) 6100 approaches (is placed in close proximity to) the digital camera 100. The eye detecting unit 4440 is an approach or placement detection sensor that detects the approach of the eye 6100 (eye placement) to and leaving of the eye 6100 (eye leaving) from an eyepiece portion 4430. The eye detecting unit 4440 detects the placement of the eye 6100 in close proximity to the eyepiece portion 4430 based on whether or not light is received by an unillustrated light receiving portion of an infrared light proximity sensor. After the eye placement is detected, the system controlling unit 4200 determines that the state is an eye placement state until the eye leaving is detected. After the eye leaving is detected, the system controlling unit 4200 determines that the state is a non-eye placement state until the eye placement is detected. The infrared light proximity sensor is an example, and another sensor may be used as the eye detecting unit 4440 as long as the sensor can detect the approach of an eye or an object that can be regarded as the eye placement.

The above-mentioned memory 4210 also serves as a memory (video memory) for displaying an image. A digital signal and image data written in the memory 4210 are displayed by a rear display unit 4500 and an EVF 4510 via the memory controlling unit 4220. The rear display unit 4500 performs the display according to a signal from the memory controlling unit 4220. The EVF 4510 performs the display according to a signal from the memory controlling unit 4220 when the eye placement is detected by the eye detecting unit 4440.

The analog signal generated by the image pickup unit 4110 is converted into a digital signal by the A/D converter 4120. This digital signal is recorded in the memory 4210. By sequentially transferring the digital signal recorded in the memory 4210 to the rear display unit 4500 or the EVF 4510 and displaying it, a live view imaging display, which is real-time display, can be performed.

The system controlling unit 4200 changes the display (display state)/non-display (non-display state) of the rear display unit 4500 and the EVF 4510 according to the state detected by the above-described eye detecting unit 4440. The system controlling unit 4200 sets the rear display unit 4500 to the display state and the EVF 4510 to the non-display state during the non-eye placement state. On the other hand, the system controlling unit 4200 sets the EVF 4510 to the display state and the rear display unit 4500 to the non-display state during the eye placement state.

The operation unit 4600 includes various operation members as an input unit that receives an operation performed by the user. The operation unit 4600 includes the rotation operation unit 200 described with reference to FIGS. 1 and 3 and various operation members described below. The various operation members include a mode changeover switch 4610, a shutter button 4620, a first shutter switch 4630, a second shutter switch 4640, a touch panel 4650, and a power switch 4660. The operation unit 4600 is used for inputting various operation instructions to the system controlling unit 4200.

As described above, the rotation operation unit 200 can input various modes and selection operations of images and the like by tilting operation in the eight directions, the pushing operation, and the rotation operation. The mode changeover switch 4610 switches the operation mode of the system controlling unit 4200 to any of a still image pickup mode, a motion image pickup mode, and the like. The image pickup modes included in the still image pickup mode include an auto imaging mode, an auto scene determination mode, a manual imaging mode, an aperture priority mode (Av mode), a shutter speed priority mode (Tv mode), and a program AE mode (P mode). Similarly, the motion image pickup mode may include a plurality of imaging modes.

The shutter button 4620 is a button for the user to give an imaging preparation instruction and an imaging instruction. A first shutter switch 4630 is turned on by a so-called half push (imaging preparation instruction) in the middle of an operation on the shutter button 4620 provided on the digital camera 100, and then a first shutter switch signal SW1 is generated. The first shutter switch signal SW1 starts imaging preparation operations such as autofocus (AF) processing, auto exposure (AE) processing, and auto white balance (AWB) processing. A second shutter switch 4640 is turned on by a so-called full push (imaging instruction) when the operation on the shutter button 4620 is completed, and then a second shutter switch signal SW2 is generated.

The second shutter switch signal SW2 causes the system controlling unit 4200 to start an image pickup processing operation. The image pickup processing operation includes operations such as reading an analog signal from the image pickup unit 4110, signal conversion processing by the A/D converter 4120 or the image processing unit 4130, and writing image data temporarily recorded in the memory 4210 into the recording medium 6000 described below.

The touch panel 4650 is a device that detects a touching operation or a dragging operation performed by the user. In this embodiment, the touch panel 4650 is integrated with the rear display unit 4500, and the touch panel 4650 can be operated by a finger touching a display portion of the rear display unit 4500.

The power switch 4660 is a switch for turning on/off the device. The power supply controlling unit 4310 controls power supply from the power supply unit 4300 by the switching operation on the power switch 4660.

The lens unit 5000 is an interchangeable lens that is detachably attachable to the digital camera 100. The lens 5010 is a group of lenses for generating an optical image (object image) from object light reflected by the object, and includes a plurality of lenses. In FIG. 4, the lens 5010 is illustrated as a single lens for simplification. The lens communication terminal 5060 is a communication terminal for the lens unit 5000 to communicate with the digital camera 100. As described above, the lens unit 5000 can communicate with the system controlling unit 4200 that controls the entire digital camera 100 in a state where the lens communication terminal 5060 and the communication terminal 4400 are electrically connected to each other. As a result, the system controlling unit 4200 can communicate with the lens system controlling circuit 5050 and a diaphragm driving circuit 5040 so as to control a position of a diaphragm 5030 and control a focusing state of a real image by moving the lens 5010.

The recording medium 6000 is detachably attachable to the digital camera 100 and is a recording medium such as a memory card for recording a captured image. The recording medium 6000 is, for example, an SD card, a FLASH (registered trademark) memory, a hard disk, or the like.

In this embodiment, the rotation operation unit 200 is tilted at an angle θ illustrated in FIG. 2 with respect to the digital camera 100 and/or the finger placing portion 300 toward the finger placing portion 300. In the rotation operation member 210 of the rotation operation unit 200, a position close to the finger placing portion 300 is referred to as a rotation operation member R2101, and a position far from the finger placing portion 300 is referred to as a rotation operation member L2102. Since the rotation operation unit 200 is tilted at the angle θ with respect to the digital camera 100, the rotation operation member L2102 projects in the Z direction of FIG. 2 further than the rotation operation member R2101. That is, the rotation operation member L2102 is closer to the user than the rotation operation member R2101, with respect to the finger placing portion 300.

When the user is to operate the rotation operation unit 200 of the digital camera 100, the user moves the thumb to the rotation operation unit 200 to operate it from a state where the user places the thumb on the finger placing portion 300, which is the holding state of the digital camera 100. Then, the user places the thumb on the rotation operation member 210 of the rotation operation unit 200 and performs the rotation operation on the rotation operation member 210. In a case where the rotation operation member 210 is operated in the vicinity of the rotation operation member R2101, which is in close proximity to the finger placing portion 300, it is easy for the user to perform the operation because a moving amount of the thumb is small. On the other hand, in a case where the rotation operation member 210 is operated in the vicinity of the rotation operation member L2102 located far from the finger placing portion 300, the user needs to extend the thumb. However, since the rotation operation unit 200 is tilted toward the finger placing portion 300, the user can easily operate the rotation operation member 201 without changing the position of the right hand gripping the front grip portion 120.

As described above, the finger placing portion 300 is provided on the rear side of the digital camera 100 at a position such that the user can grip the finger placing portion 300 with the thumb, and the front grip portion 120 is provided on the front side. When the user holds the digital camera 100, a base of the thumb may be placed near an area A in FIG. 1 so that the digital camera 100 is stably held.

Therefore, the user grips the vicinity of the area A with the hand. From this gripping state, when the user is to operate the rotation operation unit 200 of the digital camera 100, the thumb performs a rotation operation while rotating about the vicinity of the area A. The rotation operation member L2102 of the rotation operation unit 200 is located at a position most projecting in the rotation operation unit 200. Therefore, the user can operate the rotation operation member 210 without touching the tilt operation member 220 disposed at a central part of the rotation operation unit 200. This makes it possible to hinder the tilt operation member 220 from being erroneously operated when the rotation operation member 210 of the rotation operation unit 200 is operated. In this embodiment, when the rotation operation unit 200 is operated, the rotation operation unit 200 is placed at a position away from the finger placing portion 300, that is, away from the hand holding the digital camera 100. However, the rotation operation unit 200 is tilted, and the rotation operation member L2102 of the rotation operation member 210 projects toward the user side further than the finger placing portion 300. Therefore, the user can operate the rotation operation member 210 without changing the gripping position by rotating the thumb about the vicinity of the area A when operating the rotation operation member L2102 of the rotation operation member 210.

Next, a description is given of a position of the rotation operation unit 200 in the digital camera 100 according to this embodiment. A part of the rotation operation unit 200 projects from the digital camera 100, and is located on an inner side of a plane connecting a first convex portion and a second convex portion of the digital camera. A detailed description thereof is given below.

Figure 5A:
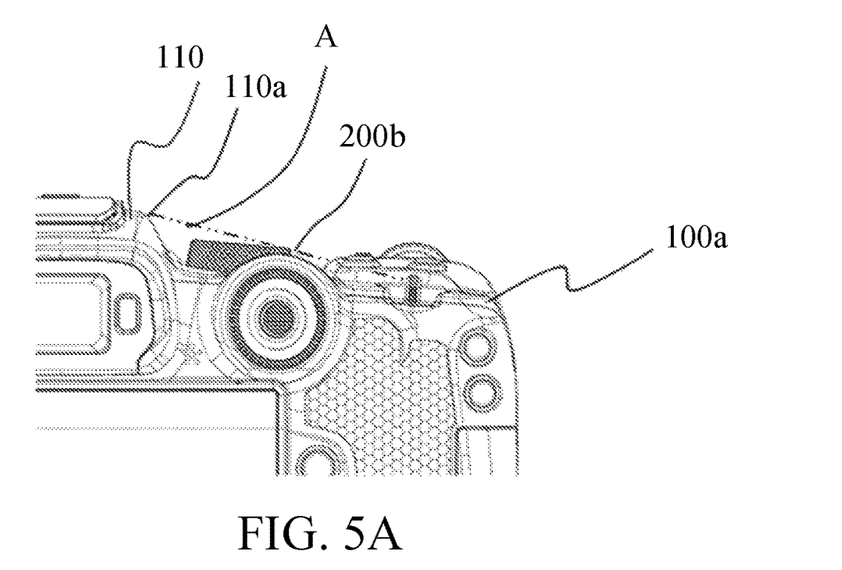
FIGS. 5A and 5B are explanatory diagrams relating to an arrangement of the rotation operation unit according to the first embodiment.
Figure 5B:
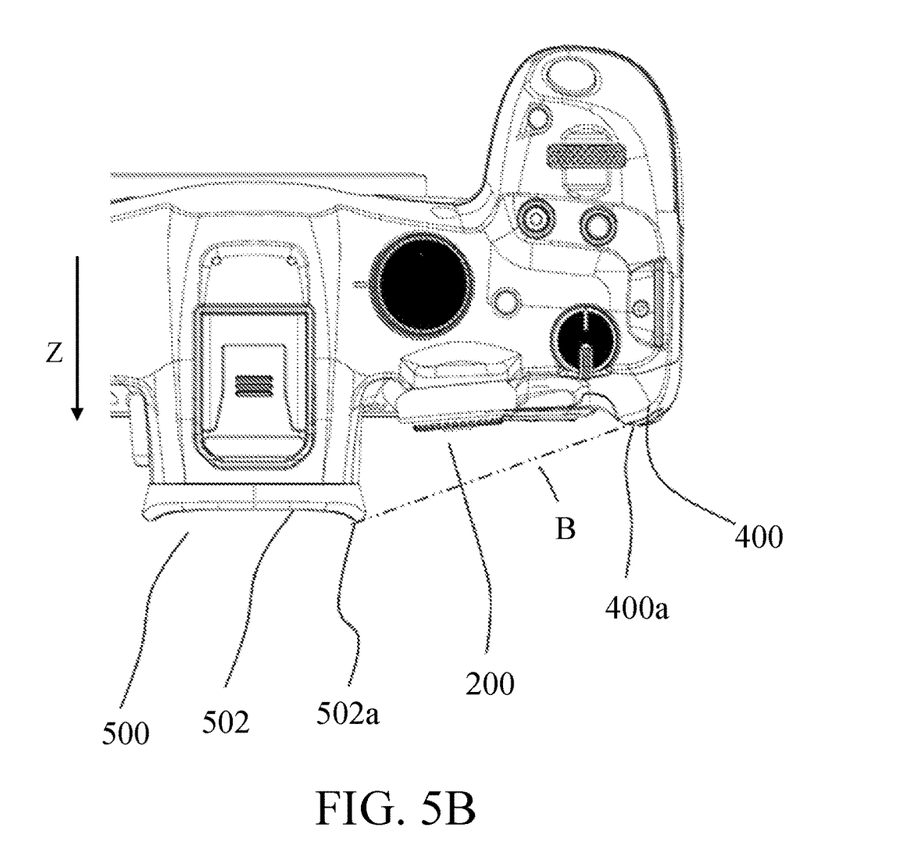

FIGS. 5A and 5B are explanatory diagrams of the arrangement of the rotation operation unit 200. FIG. 5A is a diagram illustrating the vicinity of the rotation operation unit 200 when the digital camera 100 is viewed from the rear side. FIG. 5B is a diagram illustrating the vicinity of the rotation operation unit 200 when the digital camera 100 is viewed from the upper side.

As illustrated in FIG. 5A, a rotation operation unit external portion (unit external portion) 200b is provided on an outer side of the rotation operation unit 200. The rotation operation unit external portion 200b is formed so that the rotation operation unit external portion 200b covers the rotation operation unit 200 and is included as a part of the exterior component of the digital camera 100. If the rotation operation unit 200 is located on the inner side of the digital camera 100, the digital camera 100 becomes large. In this embodiment, the rotation operation unit 200 is located at an end of the digital camera 100 and the part of the rotation operation unit 200 projects from the digital camera 100. The projecting part of the rotation operation unit 200 is covered with the rotation operation unit external portion 200b, and the arrangement becomes such that the size of the entire digital camera 100 is not increased and its operability is good. The external portion of the digital camera 100 around the finder unit 500 includes a convex portion 110 that projects from the digital camera 100. An external end 100a is formed on an external end portion of the digital camera 100. The rotation operation unit 200 and the rotation operation unit external portion 200b are located on an inner side of a straight line A connecting a vertex 110a of the convex portion 110 and the external end 100a, which function as the first and second convex portions described above, on a projection plane of the rear view of the digital camera 100.

The vertex 110a of the convex portion 110 and the external end 100a are included as parts of the top surface unit of the digital camera 100.

As illustrated in FIG. 5B, the finder unit 500 has a shape projecting in the Z direction in the digital camera 100. As described above, the finger holding convex portion 400 has the projecting shape in the digital camera 100. The rotation operation unit 200 is located on an inner side of a straight line B connecting the eyecup convex portion 502a and the convex portion vertex 400a, which function as the first and second convex portions described above, on a projection plane of the top view of the digital camera 100. The eyecup convex portion 502a is included as a part of a vertex of the eyecup 502. The convex portion vertex 400a is included as a part of a vertex of the finger holding convex portion 400 that forms a part of an external shape of the digital camera 100. The eyecup convex portion 502a and the convex portion vertex 400a form part of the rear surface unit of the digital camera 100.

Thereby, it is possible to prevent the rotation operation unit 200 and the rotation operation unit external portion 200b from directly colliding with the ground when the user unintentionally drops the digital camera 100 on the ground or the like. This is because, in the digital camera 100, the rotation operation unit external portion 200b is located on the inner side of the straight line A, and the rotation operation unit 200 is located on the inner side of the straight line B.

The rotation operation unit 200 is a multifunctional operation device and has a complicated configuration, and therefore dimensional accuracy is required. Hence, if a direct shock is applied to the rotation operation unit 200, deformation or the like is likely to occur. In the digital camera 100 according to this embodiment, the above-described configuration can hinder the occurrence of the deformation or the like. In order that the rotation operation unit 200 is protected, it is conceivable to increase a rigidity of the rotation operation unit external portion 200b, which is a peripheral member of the rotation operation unit 200, to make it stronger, but the size of the digital camera 100 main body needs to be increased.

Figure 6A:
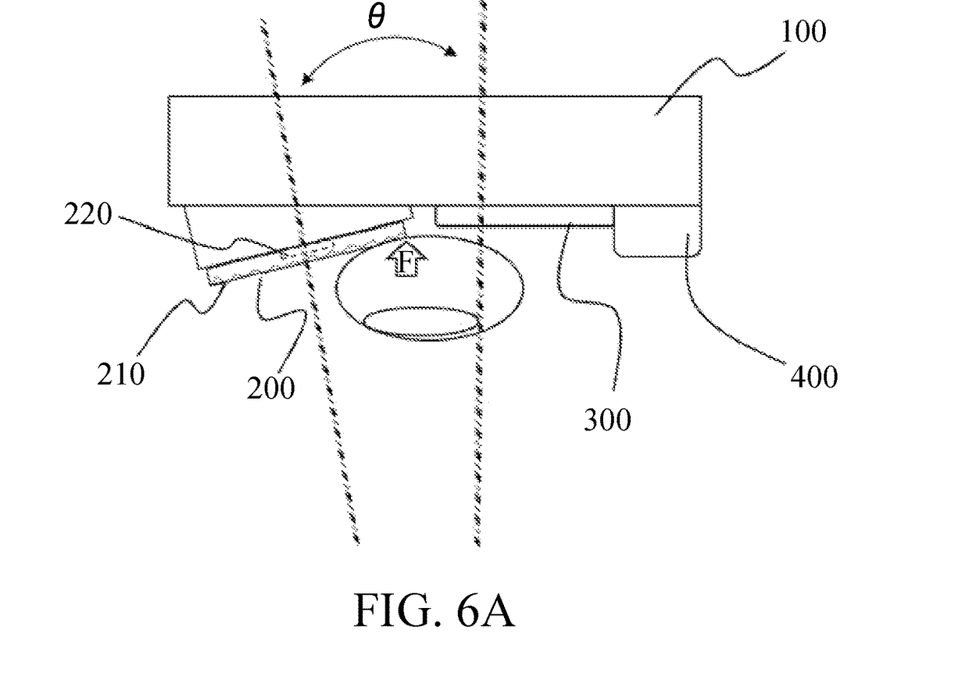
FIGS. 6A and 6B are explanatory diagrams relating to a tilt amount of the rotation operation unit relative to the digital camera according to the first embodiment.
Figure 6B:
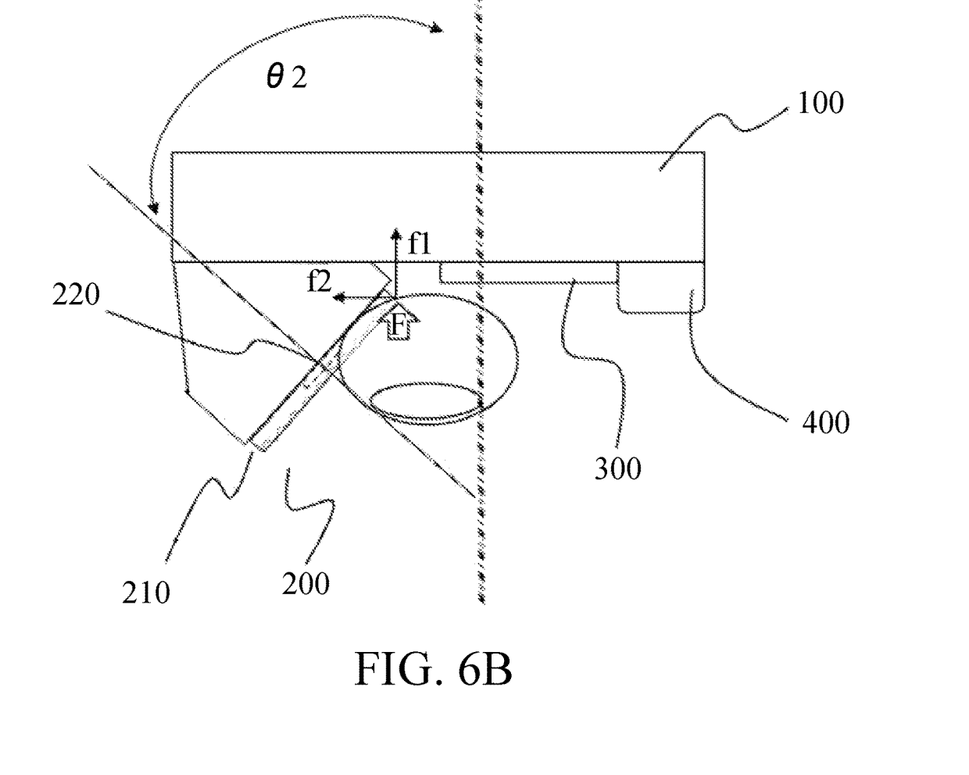

Next, a description is given of a tilt amount of the rotation operation unit 200 relative to the digital camera 100 with reference to FIGS. 6A and 6B. FIGS. 6A and 6B are schematic diagrams of the digital camera 100 when the digital camera 100 is viewed from the upper side, and are diagrams each of which illustrates a state in which the user is operating the rotation operation member 210 of the rotation operation unit 200. FIG. 6A is a diagram illustrating an optimum configuration of the angle θ, and FIG. 6B is a diagram illustrating an improper configuration of the angle θ.

As described with reference to FIG. 2, the rotation operation unit 200 is tilted at the angle θ with respect to the digital camera 100 and/or the finger placing portion 300. During the operation on the rotation operation member 210, the user operates the rotation operation member 210 while applying a force F to the rotation operation member 210 with the thumb as illustrated in FIG. 6A. As described above, since the user holds the digital camera 100 by gripping the front grip portion 120 in FIG. 2, the force F is likely to be applied in substantially the same direction as the optical axis T. Therefore, the smaller the angle θ of the rotation operation unit 200, the easier it is to rotate the rotation operation member 210. This is because in a case where the angle θ is small, the user can easily push the rotation operation member 210 by the force F for rotating the rotation operation member 210, and a frictional force is easily provided to the user. As illustrated in FIG. 6B, in a case where the angle θ of the rotation operation unit 200 is as large as an angle θ2, the force F applied when the user operates the rotation operation member 210 is dispersed in an f1 direction and an f2 direction. Therefore, the force F is not applied to the rotation axis direction (angle θ2 axis) of the rotation operation member 210, which makes it difficult for the user to operate the rotation operation member 210. Further, if the angle θ of the rotation operation unit 200 is large and the rotation operation unit 200 is largely tilted, when the user operates the rotation operation member 210 with the thumb, the thumb is likely to come into contact with the tilt operation member 220, and an erroneous operation is likely to occur. Therefore, the angle θ, which is the tilt angle of the rotation operation unit 200 with respect to the digital camera 100 and/or the finger placing portion 300, may be equal to or less than 45°, which makes it difficult for the thumb to come into contact with the tilt operation member 220 when the user operates the rotation operation member 210 with the thumb. The angle θ may be an angle such that push is not detected by the movable switch 240 even if the thumb accidentally touches the tilt operation member 220 during the operation on the rotation operation member 210.

In this embodiment, the rotation operation unit 200 is tilted with respect to the digital camera 100 so that the rotation operation member L2102 of the rotation operation member 210 is located at a position most projecting in the rotation operation unit 200, but the present disclosure is not limited to this. The effect of the present disclosure can be provided if the rotation operation member L2102 is made to project toward the user side by tilting the rotation operation unit 200 with respect to the digital camera 100, and therefore the tilt operation member 220 may be located at the position most projecting toward the user side in the rotation operation unit 200.

Second Embodiment

Figure 7:
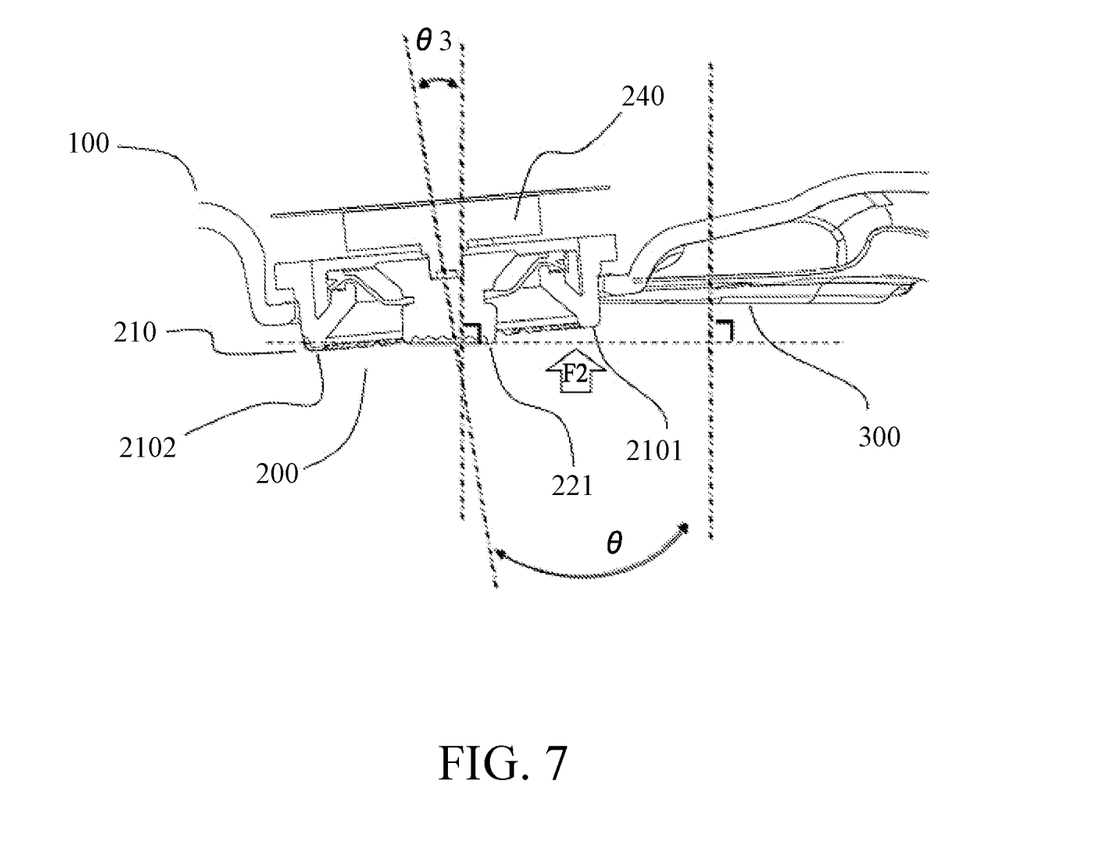
FIG. 7 is an explanatory diagram of a rotation operation unit according to a second embodiment.

Next, a description is given of a rotation operation unit 200 according to the second embodiment with reference to FIG. 7. In this embodiment, a shape of the rotation operation unit 200 is different from the shape of the rotation operation unit 200 according to the first embodiment. In particular, a tilt operation member 220 is different from the tilt operation member 220 according to the first embodiment.

In this embodiment, the rotation operation unit 200 is tilted at an angle θ with respect to a digital camera 100 and a finger placing portion 300, as in the first embodiment. A configuration of the rotation operation unit 200 is also similar to the configuration of the rotation operation unit 200 according to the first embodiment, and therefore components common to the first embodiment are designated by the same reference numerals as the first embodiment, and detailed description thereof is omitted.

FIG. 7 is a diagram illustrating a configuration of the rotation operation unit 200 and peripheral configuration when the digital camera 100 according to this embodiment is viewed from the upper side. As in the first embodiment, the rotation operation unit 200 is tilted at the angle θ with respect to the digital camera 100 and/or the finger placing portion 300 toward the finger placing portion 300.

In this embodiment, in the tilt operation member 220, a key top 221 as a part to be operated is tilted at an angle θ3 with respect to a rotation axis of a rotation operation member 210. In the first embodiment, a description is given that since the rotation operation unit 200 is tilted with respect to the digital camera 100 and/or the finger placing portion 300, the operability of the rotation operation member 210 is improved. In this case, the movable switch 240 is also tilted as described in FIG. 3. Therefore, when a user is to operate the tilt operation member 220 to operate a movable switch 240, the user needs to diagonally push the key top 221. In a case where an operational surface of the tilt operation member 220 is formed orthogonally to the rotation axis of the rotation operation unit 200 as in the first embodiment, when a force F in the operation direction described with reference to FIGS. 6A and 6B is applied, the pushing direction and the direction orthogonal to the operational surface are different. Therefore, the thumb may be likely to slip on the operational surface, which makes it difficult for the user to operate the tilt operation member 220. The angle θ3 by which the key top 221 of the tilt operation member 220 is tilted with respect to the rotation operation unit 200 is substantially the same as the angle θ described in the first embodiment in a direction opposite to the angle θ. That is, the tilting direction of the key top 221 is opposite to the tilting direction of the rotation operation unit 200, and the magnitudes of the angle θ and the angle θ3 are substantially the same. Therefore, the operational surface of the key top 221 is formed orthogonally to the direction of a force F2 illustrated in FIG. 7 (the same direction as the F1 illustrated in FIGS. 6A and 6B of the first embodiment). That is, the operational surface of the key top 221 is parallel to the digital camera 100 and/or the finger placing portion 300. This improves the operability during a pushing operation on the tilt operation member 220.

Third Embodiment

Figure 8A:
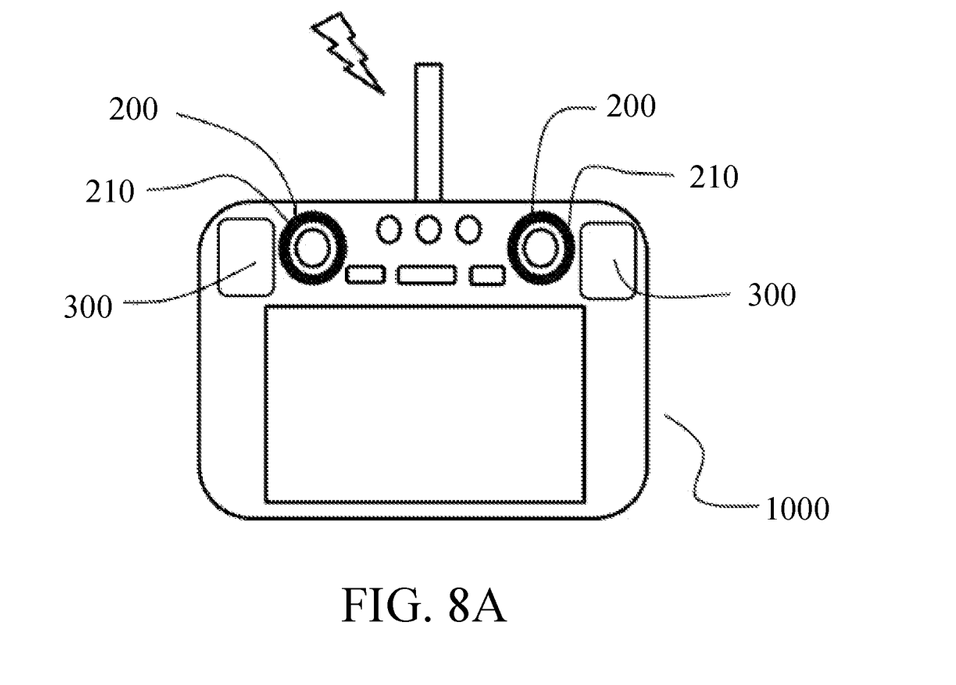
FIGS. 8A and 8B are explanatory diagrams of a controller according to a third embodiment.
Figure 8B:
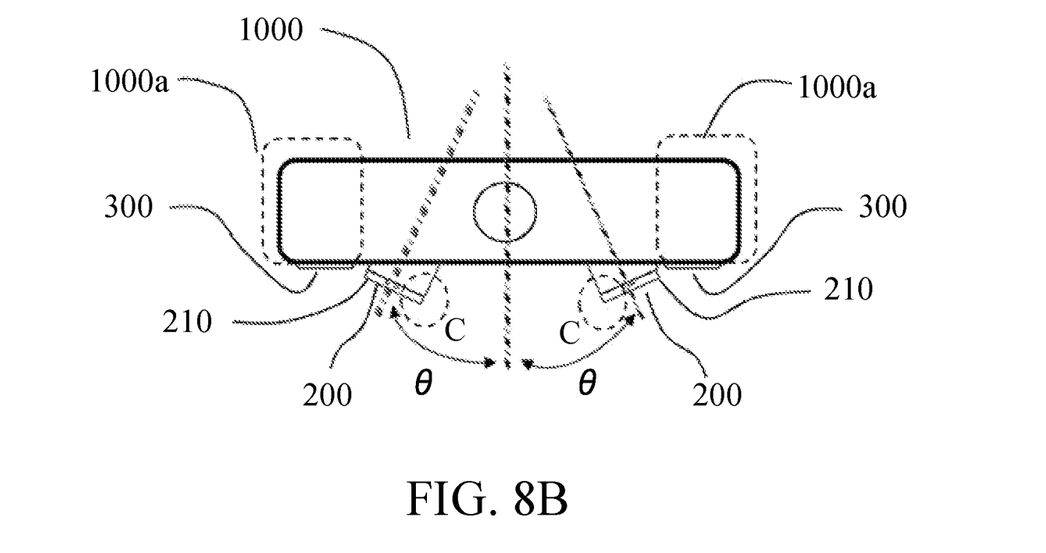

Next, a description is given of a controller 1000 dedicated for operations as an electronic device according to the third embodiment with reference to FIGS. 8A and 8B. In this embodiment, components common to the first embodiment are designated by the same reference numerals as the first embodiment, and a detailed description thereof is omitted. The controller 1000 according to this embodiment relates to a remote operation device that operates a device by a remote operation.

FIG. 8A is a schematic view of the controller 1000 according to the third embodiment as viewed from an operator (user) side. FIG. 8B is a schematic view of the controller 1000 when viewed from a top surface side. As illustrated in FIG. 8A, rotation operation units 200 is attached to the controller 1000 at symmetrical positions in a left-right direction. In the vicinity of the rotation operation unit 200 of the controller 1000, finger placing portions 300 on each of which a thumb is placed when a user grips the controller 1000 is provided at symmetrical positions in the left-right direction. The rotation operation units 200 and the finger placing portions 300 are located at an upper side of the controller 1000. One rotation operation unit 200 and one finger placing portion 300 are located at positions corresponding to the vicinity of one thumb of one hand when the user holds the controller 1000 with both hands, and the other rotation operation unit 200 and the other finger placing portion 300 are located at positions corresponding to the vicinity of the other thumb of the other hand when the user holds the controller 1000 with both hands. That is, on the controller 1000, two operation units each of which includes the rotation operation unit 200 and the finger placing portion 300 are arranged at symmetrical positions in the left-right direction.

The two rotation operation units 200 provided on the controller 1000 are multifunctional rotation operation devices described in the first embodiment. That is, each of the two rotation operation units 200 can be used to perform an inputting operation by a rotation operation on the rotation operation member 210 in an outer circumferential portion, and by an eight-direction operation or a pushing operation on the tilt operation member 220 in a rotation axis portion. In this embodiment, two rotation operation units 200 are provided, but the present disclosure is not limited to this, and one rotation operation unit 200 may be provided only on one side, or three or more rotation operation units 200 may be provided.

As illustrated in FIG. 8B, the rotation operation unit 200 is attached to the controller 1000 and is tilted at an angle θ with respect to the finger placing portion 300. Therefore, portions C in FIG. 8B are at positions most projecting in the controller 1000. Thereby, when the user rotates the rotation operation member 210 of the rotation operation unit 200, the user can easily operate the rotation operation member 210 while maintaining a gripping state even when the user operates the C portions far from grip portions 1000a.

Figure 9:
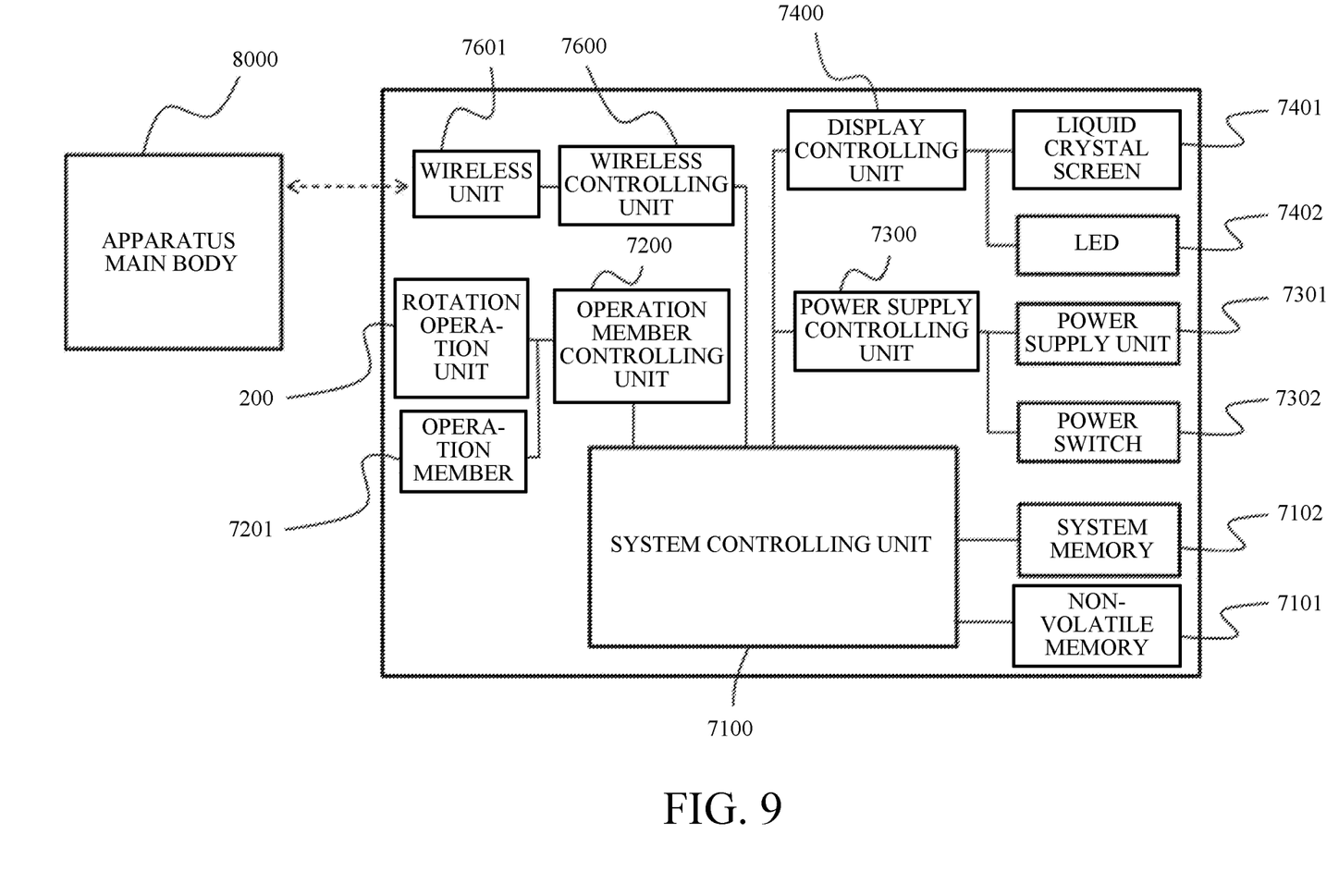
FIG. 9 is a block diagram illustrating a system configuration of the controller according to a third embodiment.

Next, a description is given of a system configuration of the controller 1000 according to this embodiment. FIG. 9 is a block diagram illustrating the system configuration of the controller 1000 according to this embodiment.

A system controlling unit 7100 includes at least one processor or circuit, and controls the entire controller 1000. The system controlling unit 7100 realizes each process by executing a program recorded in a non-volatile memory 7101 described below. When the rotation operation unit 200 or the other operation member 7201 described with reference to FIGS. 8A and 8B is operated, an operation signal is input to an operation member controlling unit 7200. The signal input to the operation member controlling unit 7200 is controlled by the system controlling unit 7100. A system memory 7102 is a readable and writable memory that stores a constant, a variable, a program read from the non-volatile memory 7101, and the like for operation of the system controlling unit 7100. A power supply unit 7301 includes a primary battery such as an alkaline battery and a lithium battery, a secondary battery such as a NiCd battery, a NiMH battery, and a Li battery, an AC adapter, and the like. A power switch 7302 is a member for turning on/off the controller 1000.

A power supply controlling unit 7300 includes a circuit for detecting a power supply unit 7301, which is a power supply for driving the controller 1000, when the power switch 7302 performs the turning on/off, a DC-DC converter, a switch circuit for changing a power supply destination, and the like. The power supply controlling unit 7300 detects the turning on/off of the controller 1000, whether a battery is attached, a type of the battery, and a remaining battery level. A display controlling unit 7400 includes a memory (video memory) for displaying an image, and displays image data and a recognition signal written by the system controlling unit 7100 on a liquid crystal screen 7401 and an LED 7402. The liquid crystal screen 7401 displays an image and the LED 7402 turns on light according to a signal from the display controlling unit 7400.

A wireless controlling unit 7600 controls communication with an apparatus main body 8000 to be remotely controlled via a wireless unit 7601, acquires an operation signal input to the operation member controlling unit 7200 from the system controlling unit 7100, and transmits the operation signal to the apparatus main body 8000. The wireless controlling unit 7600 receives data from the apparatus main body 8000 and displays it on the liquid crystal screen 7401. The wireless unit 7601 transmits and receives signals from the apparatus main body 8000 and from the wireless controlling unit 7600 by wireless communication.

According to the above-described embodiments, it is possible to provide an electronic device with a configuration including a finger placing portion and a rotation operation member on which rotational operation can be performed, and the electronic device enables a stable rotational operation on the rotation operation member while the electronic device is stably held.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-133406, filed on Aug. 18, 2021, which is hereby incorporated by reference herein in its entirety.

What is claimed is:

1. An electronic device comprising:
a rotation operation unit including a rotation operation member; and
a placing portion configured so that part of a user's hand is placed on it when the electronic device is gripped,
wherein the rotation operation unit and the placing portion are located in close proximity to each other on a surface on a user side of the electronic device,
wherein the rotation operation unit is disposed to be tilted with respect to the electronic device toward the placing portion, regardless of whether the rotation operation unit is operated or not by the user;
wherein the rotation operation unit includes:
a switch disposed on a same axis as the rotation operation member; and
a pusher member configured to be used for pushing the switch; and
wherein an operational surface of the pusher member is parallel to the electronic device.

2. The electronic device according to claim 1, wherein an operational surface of the pusher member is tilted with respect to a plane that is orthogonal to the axis of the rotation operation member in a direction opposite to a direction in which the rotation operation unit is tilted.

3. The electronic device according to claim 1, wherein the rotation operation unit is tilted with respect to the electronic device toward the placing portion at an angle such that the switch is not erroneously operated when the rotation operation member is operated.

4. The electronic device according to claim 1, wherein a part of the rotation operation unit projects from the electronic device,
wherein the electronic device includes a first convex portion and a second convex portion, and
wherein the rotation operation unit is disposed on an inner side of a plane connecting the first convex portion and the second convex portion.

5. The electronic device according to claim 4, further comprising a unit external portion configured to cover the part of the rotation operation unit projecting from the electronic device and to be included as a part in an exterior component of the electronic device,
wherein the unit external portion is disposed on the inner side of the plane connecting the first convex portion and the second convex portion.

6. The electronic device according to claim 4, wherein the first convex portion and the second convex portion are included as a part in a top surface unit of the electronic device.

7. The electronic device according to claim 1, wherein the first convex portion and the second convex portion are included as a part in a rear surface unit of the electronic device.

8. The electronic device according to claim 1, further comprising a holding convex portion, wherein the placing portion is located between the holding convex portion and the rotation operation unit.

9. The electronic device according to claim 1, wherein the rotation operation unit is tilted at an angle of 45° or less with respect to the electronic device toward the placing portion.

10. The electronic device according to claim 1, wherein the electronic device is an image pickup apparatus.

11. The electronic device according to claim 1, wherein two operation units each of which includes the rotation operation unit and the placing portion are arranged at symmetrical positions in a right-left direction.

12. The electronic device according to claim 1, wherein the rotation operation unit is configured to be tilted at a predetermined angle with respect to the electronic device toward the placing portion.

* * * * *